United States Patent
Chen et al.

(10) Patent No.: US 10,993,340 B2
(45) Date of Patent: Apr. 27, 2021

(54) WATERPROOF CARD HOLDER AND METAL CASING

(71) Applicant: SHENZHEN EVERWIN PRECISION TECHNOLOGY CO LTD, Guangdong (CN)

(72) Inventors: Xiaoshuo Chen, Guangdong (CN); Su Lu, Guangdong (CN); Yayong Li, Guangdong (CN)

(73) Assignee: SHENZHEN EVERWIN PRECISION TECHNOLOGY CO LTD, Guangdong (CN)

( * ) Notice: Subject to any disclaimer, the term of this patent is extended or adjusted under 35 U.S.C. 154(b) by 0 days.

(21) Appl. No.: 16/739,164

(22) Filed: Jan. 10, 2020

(65) Prior Publication Data

US 2020/0154585 A1   May 14, 2020

Related U.S. Application Data

(62) Division of application No. 16/348,956, filed as application No. PCT/CN2018/088202 on May 24, 2018.

(30) Foreign Application Priority Data

Jun. 21, 2017  (CN) .......................... 201710477581.1
Jul. 5, 2017   (CN) .......................... 201710542188.6

(51) Int. Cl.
*H05K 5/02*    (2006.01)
*H04B 1/3818*  (2015.01)
(Continued)

(52) U.S. Cl.
CPC ......... *H05K 5/0286* (2013.01); *G06F 1/1656* (2013.01); *H01R 12/7076* (2013.01);
(Continued)

(58) Field of Classification Search
CPC .............. H01R 13/5202; H01R 12/714; H01R 13/5213; H01R 12/721; H01R 13/5219;
(Continued)

(56) References Cited

U.S. PATENT DOCUMENTS

| 2016/0111802 | A1* | 4/2016 | Shimotsu ............. H01R 13/633 439/159 |
| 2017/0179659 | A1* | 6/2017 | Motohashi ............. H01R 27/00 |
| 2018/0248987 | A1* | 8/2018 | Cha ....................... H04B 1/3888 |

FOREIGN PATENT DOCUMENTS

| CN | 205122879 U | 3/2016 |
| CN | 205912039 U | 1/2017 |

(Continued)

OTHER PUBLICATIONS

International Search Report for International application No. PCT/CN2018/088202 dated Aug. 17, 2018.

*Primary Examiner* — Golam Sorowar
(74) *Attorney, Agent, or Firm* — Carlson, Gaskey & Olds

(57) ABSTRACT

A waterproof card holder includes a card holder frame, a cover plate, a sleeve integrated with and extending from an inside of the cover plate, and a waterproof mechanism in the sleeve. A through-hole of the sleeve penetrates through the sleeve and cover plate. The waterproof mechanism includes a first end portion limited inside the sleeve, a second end portion having an outer diameter smaller than that of the first end portion, and a waterproof ring sleeved on a periphery of the first end portion and forming a sliding sealing structure with the sleeve. The sleeve includes first and second openings respectively disposed at two ends of a sleeve body. The first end portion is limited to be only movable within a stroke between the first and second openings. The second end portion being capable of passing through a first opening to be in contact with a card retracting mechanism.

13 Claims, 10 Drawing Sheets

(51) Int. Cl.
  *G06F 1/16*    (2006.01)
  *H01R 12/70*   (2011.01)
  *H05K 5/04*    (2006.01)
  *H04B 1/38*    (2015.01)
  *H01R 13/62*   (2006.01)
(52) U.S. Cl.
  CPC ............... *H01R 13/62* (2013.01); *H04B 1/38* (2013.01); *H04B 1/3818* (2015.01); *H05K 5/04* (2013.01); *H04B 2001/3894* (2013.01)
(58) Field of Classification Search
  CPC .. H01R 13/629; H01R 13/633; H01R 13/635; H01R 2201/06; H01R 12/7076; H01R 13/2442; H01R 13/2464; H01R 27/00; H01R 43/005; H04B 1/3816; H04B 1/3818; H04B 1/3888; H04B 2001/3894; G06K 13/08; G06K 13/0831; G06K 7/0021; G06K 13/0806; G06K 13/0812; G06K 13/0825; G06K 13/14
  See application file for complete search history.

(56)    References Cited

FOREIGN PATENT DOCUMENTS

| | | | |
|---|---|---|---|
| CN | 107257247 A | 10/2017 | |
| CN | 107508610 A | 12/2017 | |

* cited by examiner

WATERPROOF CARD HOLDER AND METAL CASING

CROSS-REFERENCE TO RELATED APPLICATIONS

This application is a divisional application of U.S. patent application Ser. No. 16/348,956, filed on May 10, 2019, which is the U.S. National Stage Application of International Application No. PCT/CN2018/088202, filed on May 24, 2018, which claims priority to Chinese Patent Application No. 201710477581.1, filed on Jun. 21, 2017, and Chinese Patent Application No. 201710542188.6, filed on Jul. 5, 2017. The disclosure of all of the aforementioned patent applications are hereby incorporated by reference in their entireties.

TECHNICAL FIELD

The present disclosure relates to the technical field of waterproof design of a mobile terminal, and particularly, to a waterproof card holder and a metal casing.

BACKGROUND

An electronic card seat of a smart phone is generally used to carry a personal identification card, a memory card, and the like. However, due to factors relating to a service operator or personal preference, the existing card seat is required to allow placing and taking the electronic card from the outside, and a special structure of the card seat causes difficulty in waterproof design.

The existing card seat generally includes a drawer seat for carrying an electronic card. The drawer seat has a tail portion provided with a cover plate configured to fit in a frame side of a mobile phone. The cover plate is provided with a small hole, into which a needle is to be inserted for retracting the card. Another side of the small hole is an end of a push rod of a card release mechanism of the card seat. The small hole cannot be blocked, which otherwise causes the difficulty in the waterproof design.

SUMMARY

In view of above, the present disclosure provides a waterproof card holder, a card seat, a metal casing and a mobile terminal, aiming to solve the waterproof problem of a mobile terminal such as a mobile phone or a tablet computer.

In order to solve the above technical problem, the present disclosure provides a technical solution. The present disclosure provides a waterproof card holder, including a card holder frame, and a cover plate located at top of the card holder frame. The waterproof card holder further includes a sleeve integrated with and extending from an inner side of the cover plate and a through-hole penetrating through the sleeve and the cover plate. A waterproof mechanism is accommodated in the sleeve, and the waterproof mechanism includes a main body, a first end portion located inside the sleeve, a second end portion protruding from the sleeve, and a waterproof ring located on a periphery of the main body and close to the first end portion. The waterproof ring and the sleeve form a sliding sealing structure therebetween. A waterproof circle is disposed on a periphery of the cover plate, and the waterproof circle and an inner side wall of a slot of a metal casing form a sealing structure therebetween.

In an example embodiment, the main body of the waterproof mechanism has an outer diameter smaller than an inner diameter of the sleeve; and in a state when a card is inserted, the main body of the waterproof mechanism is completely accommodated in the sleeve, and the second end portion is blocked to be outside the sleeve.

In an example embodiment, the second end portion has an outer diameter greater than the inner diameter of the sleeve, and a part of the first end portion has an outer diameter equal to the inner diameter of the sleeve.

In an example embodiment, a recess is formed in an outer end of the first end portion for position fixing of a card-retracting needle and being abutted against the card-retracting needle.

In an example embodiment, the waterproof card holder or the cover plate is manufactured by a CNC process or a powder metallurgy process.

In order to solve the above technical problem, the present disclosure provides another technical solution. The present disclosure provides a waterproof card holder, including a card holder frame, and a cover plate located at top of the card holder frame. The waterproof card holder further includes a sleeve integrated with and extending from an inner side of the cover plate and a through-hole penetrating through the sleeve and the cover plate. A waterproof mechanism is accommodated in the sleeve, and the waterproof mechanism includes a first end portion limited to be inside the sleeve, a second end portion having an outer diameter smaller than that of the first end portion, and a waterproof ring sleeved on a periphery of the first end portion. The waterproof ring and the sleeve form a sliding sealing structure therebetween. The sleeve includes a sleeve body, a first opening and a second opening. The first opening and the second opening are disposed at two ends of the sleeve body, respectively. The first end portion is limited to be only movable within a stroke between the first opening and the second opening. The second end portion is capable of passing through the first opening to be in contact with a card retracting mechanism.

In an example embodiment, a waterproof circle is disposed on a periphery of the cover plate, and the waterproof circle and an inner side wall of a slot of a metal casing form a sealing structure.

In an example embodiment, the first opening has an inner diameter smaller than an outer diameter of the first end portion.

In an example embodiment, a first blocking slope is formed at a junction between the first end portion and the second end portion, and a second blocking slope, corresponding to and cooperating with the first blocking slope, is formed on a side of the first opening facing the second opening.

In an example embodiment, the waterproof mechanism is inserted from the second opening of the sleeve, and once the sleeve is inserted, an open-ring metal elastic member having an inner diameter smaller than an outer diameter of the first end portion is clipped in the second opening, or the second opening is stamped in such a manner that the inner diameter of the second opening becomes smaller and is smaller than the outer diameter of the first end portion.

In an example embodiment, the waterproof mechanism is inserted from the second opening of the sleeve, and once the sleeve is inserted, an open-ring metal elastic member having an inner diameter smaller than an outer diameter of the first end portion is fitted in the second opening, or the second opening is stamped in such a manner that the inner diameter of the second opening is smaller than the outer diameter of the first end portion.

In an example embodiment, the second opening has an inner diameter smaller than an outer diameter of the first end portion, the waterproof mechanism is inserted from the first opening of the sleeve, and once the sleeve is inserted, the first opening is pressed towards a circle center in such a manner that an inner diameter of the first opening is smaller than the outer diameter of the first end portion.

In an example embodiment, the second opening has an inner diameter smaller than an outer diameter of the first end portion, the waterproof mechanism is inserted from the first opening of the sleeve, and once the sleeve is inserted, an open-ring metal elastic member having an inner diameter smaller than an outer diameter of the first end portion is riveted in the first opening.

In order to solve the above technical problem, the present disclosure provides another technical solution. The present disclosure provides a card seat using the waterproof card holder described above. The card seat incudes a terminal module, a metal casing, and a card retracting mechanism. The card holder is configured to carry an electronic card and move between the metal casing and the terminal module. The card retracting mechanism incudes a push rod mounted on a lateral side of the card seat. The second end portion of the waterproof mechanism cooperates with an end portion of the push rod.

In an example embodiment, a protrusion is formed at an end surface of the second end portion of the waterproof mechanism, and a groove corresponding to the protrusion is provided in an end surface of the end portion of the push rod, so as to achieve position fixing of the waterproof mechanism and the push rod, thereby preventing an applied force from being skewed.

In order to solve the above technical problem, the present disclosure provides another technical solution. The present disclosure provides a mobile terminal, including the above waterproof card seat.

In order to solve the above technical problem, the present disclosure provides another technical solution. The present disclosure provides a metal casing, including a frame portion, a slot penetrating through the frame portion, and a sleeve integrated with and extending from an inner side of the frame portion. A card holder for an electric card being to be inserted through the slot. The sleeve is hollow to form a through-hole penetrating through the frame portion, a waterproof mechanism is accommodated in the sleeve, and the waterproof mechanism includes a main body, a first end portion accommodated inside the sleeve, a second end portion opposite to the first end portion, and a waterproof ring located on a periphery of the main body and close to the first end portion. The waterproof ring and an inner wall of the sleeve form a sealing structure, and the waterproof mechanism is movable by being pushed in an extending direction of the sleeve.

In an example embodiment, the main body of the waterproof mechanism has an outer diameter smaller than an inner diameter of the sleeve; and in a state when a card is inserted, the main body of the waterproof mechanism is completely accommodated in the sleeve, and the second end portion is blocked to be outside the sleeve.

In an example embodiment, the second end portion has an outer diameter greater than the inner diameter of the sleeve, and a part of the first end portion has an outer diameter equal to the inner diameter of the sleeve.

In an example embodiment, a recess is formed in an outer end of the first end portion for position fixing of a card-retracting needle and being abutted against the card-retracting needle.

In an example embodiment, the card holder includes a card holder frame, a cover plate located at top of the card holder frame, and a waterproof circle sleeved on a periphery of the cover plate, wherein the waterproof circle on the periphery of the cover plate and the slot form a sealing structure therebetween.

In an example embodiment, the card holder includes a card holder frame, a cover plate located at top of the card holder frame, a connecting portion located between the card holder frame and the cover plate, and a waterproof circle sleeved on a periphery of the connecting portion, wherein the waterproof circle outside the connecting portion and the slot form a sealing structure therebetween.

In order to solve the above technical problem, the present disclosure provides another technical solution. The present disclosure provides a metal casing, including a frame portion, a slot penetrating through the frame portion, and a sleeve integrated with an inner side of the frame portion. A card holder for an electric card is to be inserted through the slot. The sleeve is hollow to form a through-hole penetrating through the frame portion. A waterproof mechanism is mounted in the sleeve, and the waterproof mechanism includes a first end portion limited to be inside the sleeve, a second end portion having an outer diameter smaller than that of the first end portion, and a waterproof ring located on a periphery of the first end portion. The waterproof ring and an inner wall of the sleeve form a sliding sealing structure. The waterproof mechanism is movable by being pushed in an extending direction of the sleeve. The sleeve includes a sleeve body, a first opening and a second opening, the first opening and the second opening being disposed at two ends of the sleeve body, respectively. The first end portion is limited to be only movable within a stroke between the first opening and the second opening, and the second end portion is capable of passing through the first opening to be in contact with a card retracting mechanism.

In an example embodiment, the first opening has an inner diameter smaller than an outer diameter of the first end portion.

In an example embodiment, a first blocking slope is formed at a junction between the first end portion and the second end portion, and a second blocking slope, corresponding to and cooperating with the first blocking slope, is formed on a side of the first opening facing the second opening.

In an example embodiment, a recess is formed in an outer end of the first end portion for position fixing of a card-retracting needle and being abutted against the card-retracting needle.

In an example embodiment, the card holder includes a card holder frame, a cover plate located at top of the card holder frame, and a waterproof circle sleeved on a periphery of the cover plate, wherein the waterproof circle on the periphery of the cover plate and the slot form a sealing structure therebetween.

In an example embodiment, the waterproof mechanism is inserted from the second opening of the sleeve, and once the sleeve is inserted, an open-ring metal elastic member having an inner diameter smaller than an outer diameter of the first end portion is clipped in the second opening, or the second opening is stamped in such a manner that the inner diameter of the second opening becomes smaller and is smaller than the outer diameter of the first end portion.

In an example embodiment, the waterproof mechanism is inserted from the second opening of the sleeve, and once the sleeve is inserted, a side of the sleeve close to the second opening is pressed towards a circle center to form a position limiting ring having an inner diameter smaller than the outer diameter of the first end portion.

In an example embodiment, the second opening has an inner diameter smaller than an outer diameter of the first end portion, the waterproof mechanism is inserted from the first opening of the sleeve, and once the sleeve is inserted, the first opening of the sleeve is pressed towards a circle center in such a manner that an inner diameter of the first opening becomes smaller and is smaller than the outer diameter of the first end portion.

In an example embodiment, the second opening has an inner diameter smaller than an outer diameter of the first end portion, the waterproof mechanism is inserted from the first opening of the sleeve, and once the sleeve is inserted, an open-ring metal elastic member having an inner diameter smaller than an outer diameter of the first end portion is riveted in the first opening.

In order to solve the above technical problem, the present disclosure provides another technical solution. The present disclosure provides a mobile terminal, including the metal casing described above.

In the waterproof card holder, the card seat, and the mobile terminal according to the present disclosure, the sleeve is provided to integrally extend from the through-hole of the cover plate of the card holder towards the card seat, and the waterproof mechanism is disposed within the sleeve and forms a sealing structure together with the sleeve, so that the card retraction and waterproof property can be achieved at the same time through movement of the waterproof mechanism.

In the metal casing, and the mobile terminal according to the present disclosure, the sleeve integrated with and extending from an inner side of the frame portion is provided, and the waterproof mechanism is disposed within the sleeve and forms a sealing structure together with the sleeve, so that the card retraction and waterproof property can be achieved at the same time through movement of the waterproof mechanism.

BRIEF DESCRIPTION OF DRAWINGS

The accompanying drawings described herein are intended to provide a further understanding of the present disclosure, and belong to a part of the present disclosure. The illustrative embodiments of the present disclosure and description thereof aim to explain the present disclosure, instead of constituting an undue limitation of the present disclosure.

FIG. 1 is a perspective assembled diagram of a waterproof card seat according to the present disclosure;

FIG. 2 is a perspective diagram of a card holder and waterproof members of a waterproof card seat according to the present disclosure;

FIG. 3 is a cross-sectional view taken along a dashed line A-A shown in FIG. 1 according to the present disclosure;

FIG. 4 is a partial enlarged view of a dashed circle shown in FIG. 3 according to the present disclosure;

FIG. 5 is a perspective diagram of a metal casing fitted in a waterproof card seat according to the present disclosure;

FIG. 6 is a cross-sectional view taken along a dashed line B-B shown in FIG. 5;

FIG. 7 is an exploded view of a metal casing, a card holder, and a waterproof mechanism according to the present disclosure;

FIG. 8 is a partial enlarged view of a dashed circle shown in FIG. 7;

FIG. 9 is a perspective assembled diagram of a waterproof card seat according to the present disclosure;

FIG. 10 is a perspective diagram of a waterproof mechanism of a waterproof card seat according to the present disclosure;

FIG. 11 is a perspective diagram of a card holder and a waterproof mechanism of a waterproof card seat according to the present disclosure;

FIG. 12 is a partial enlarged view of a dashed circle shown FIG. 11 according to the present disclosure;

FIG. 13 is a perspective diagram of a metal casing fitted in a waterproof card seat according to the present disclosure;

FIG. 14 is a cross-sectional view of the metal casing taken along a dashed line B-B shown in FIG. 13 according to the present disclosure;

FIG. 15 is an exploded view of a metal casing, a card holder, and a waterproof mechanism according to the present disclosure; and FIG. 16 is a cross-sectional view of the metal casing and the waterproof mechanism taken along the dashed line B-B shown in FIG. 13 according to the present disclosure.

DESCRIPTION OF EMBODIMENTS

In order to clarify the purposes, technical solutions, and advantages of the present disclosure, the technical solutions of the present disclosure will be clearly and fully described with reference to specific embodiments and accompanying drawings of the present disclosure. It is apparent that the described embodiments are only a part of the embodiments of the present disclosure, rather than all of them. All other embodiments, which are obtained by those skilled in the art based on the disclosed embodiments of the present disclosure without departing from the inventive scope, shall fall within the scope of the present disclosure.

Embodiment 1

Figure 1:
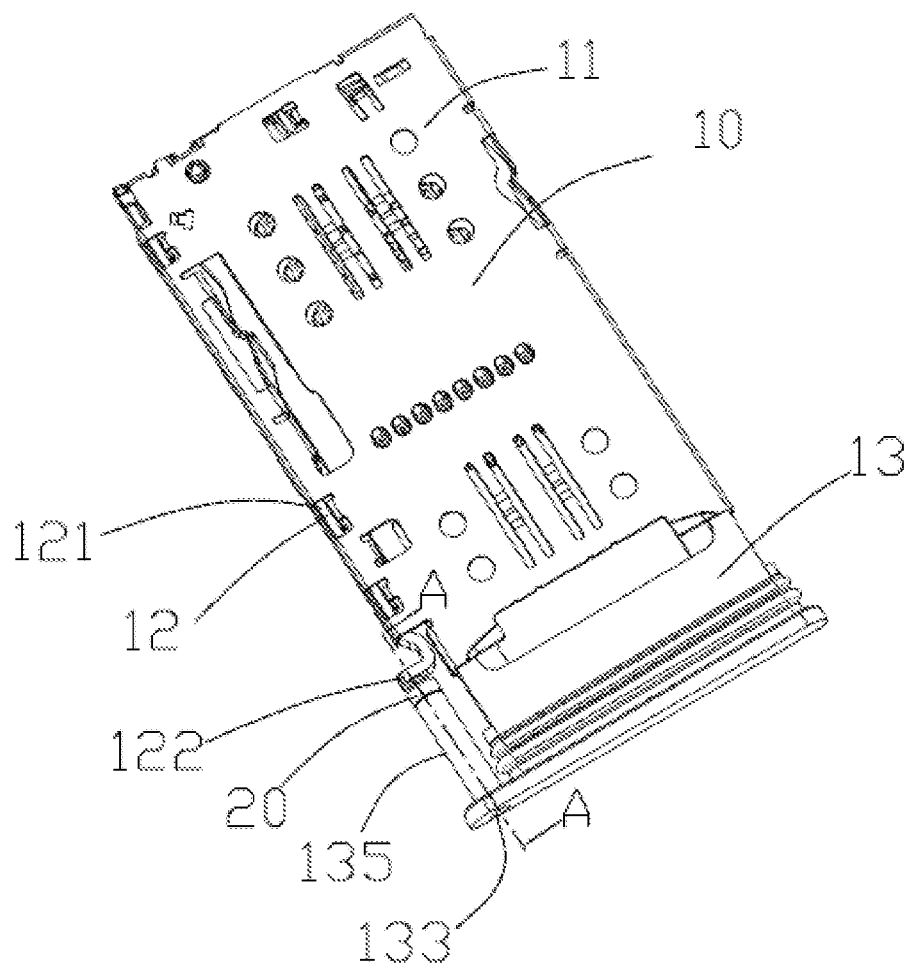
FIG. 1 to FIG. 4 are schematic diagrams of a waterproof card seat according to Embodiment 1 of the present disclosure.
Figure 2:
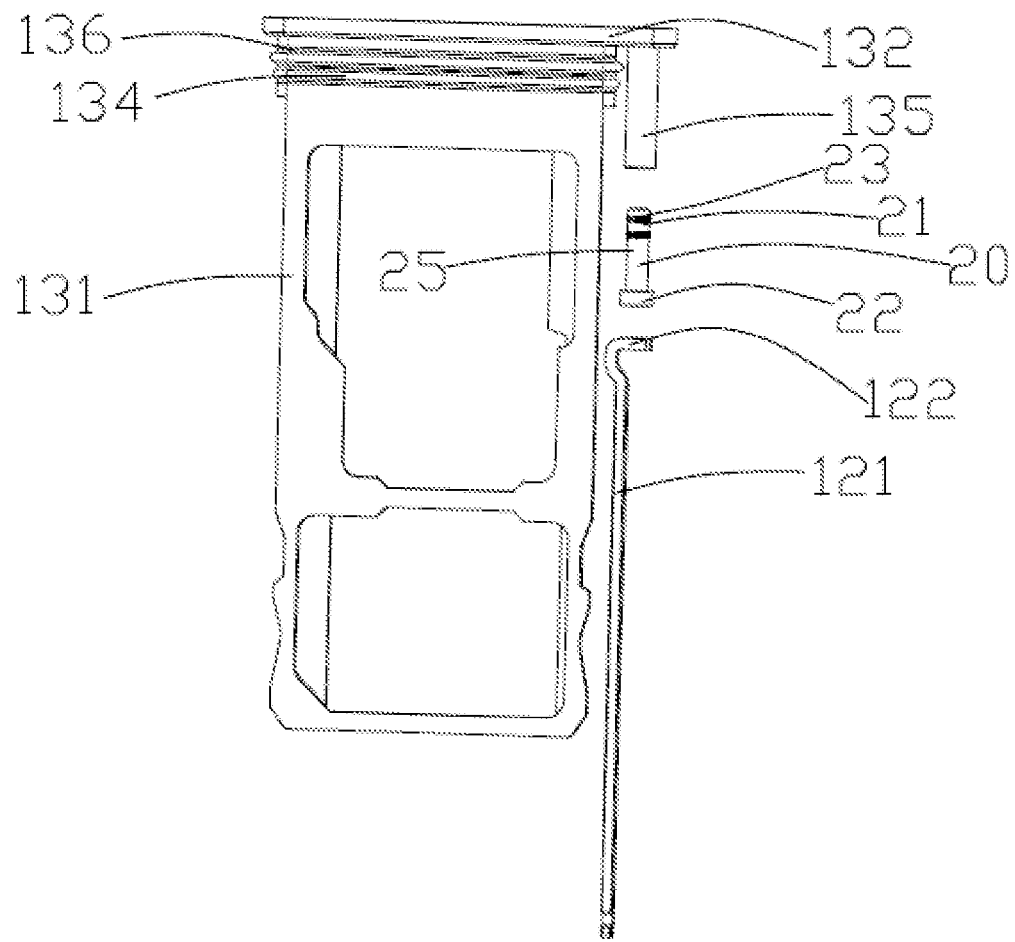
Figure 3:
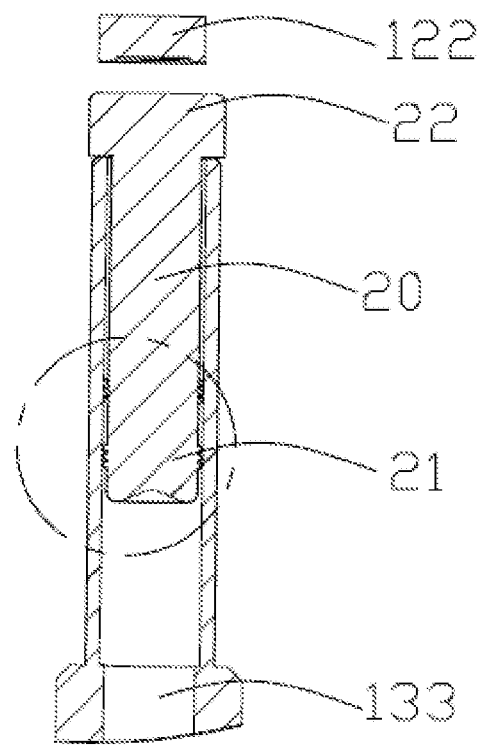
Figure 4:
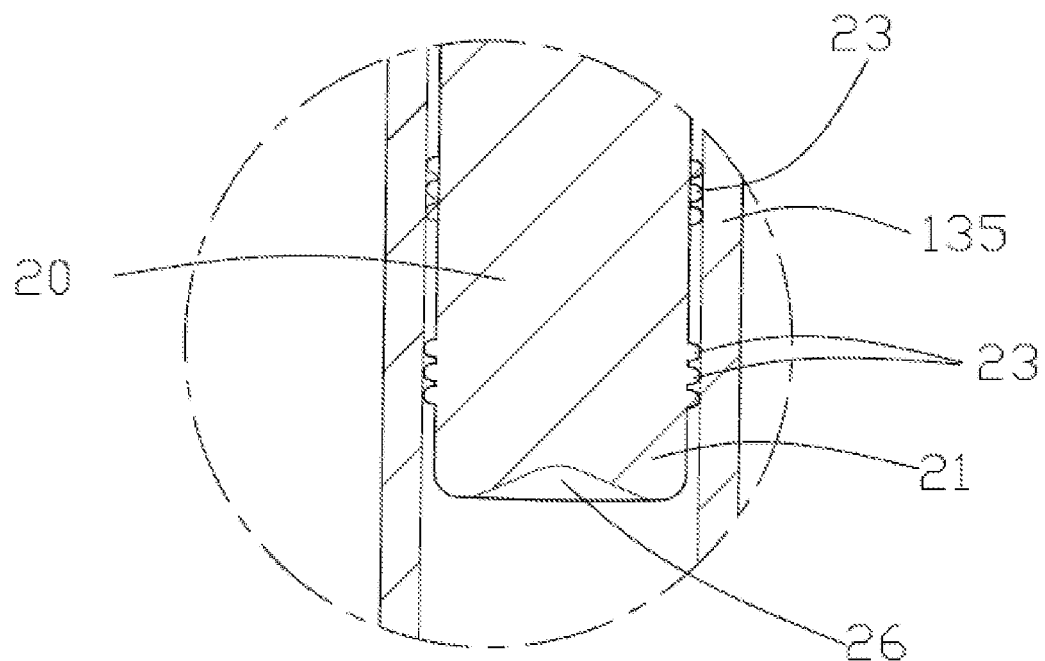

Referring to FIG. 1 to FIG. 4, a waterproof card seat according to the present disclosure includes a terminal module (not shown), a metal casing 11, a card retracting mechanism 12, a card holder 13, and a waterproof mechanism 20. The card holder 13 is configured to carry an electronic card and move between the metal casing 11 and the terminal module. The card retracting mechanism 12 includes a push rod 121 mounted on a lateral side of the card seat 10, and an end portion 122 of the push rod 121 abuts against and fits into an end of the waterproof mechanism 20.

The card holder 13 according to the present disclosure includes a card holder frame 131, a cover plate 132 located at the top of the card holder frame 131, a connecting portion 134 located between the card holder frame 131 and the cover plate 132, a waterproof circle 136 sleeved on an outer periphery of the connecting portion 134 or the cover plate 132, a sleeve 135 integrated with and extending from an inner side of the cover plate 132, and a through-hole 133 penetrating through the sleeve 135 and the cover plate 132.

The waterproof mechanism 20 includes a main body 25, a first end portion 21 located inside the sleeve 135, a second end portion 22 protruding from the sleeve 135, and a waterproof ring 23 located on a part of the main body 25 close to the first end portion 21. An outer diameter of the main body 25 is smaller than an inner diameter of the sleeve 135, an outer diameter of the second end portion 22 is greater than the inner diameter of the sleeve 135, and an outer diameter of a part of the first end portion 21 is equal to the inner diameter of the sleeve 135. A recess 26 is formed in an outer end of the first end portion 21 to be abutted by a card-retracting needle (not shown). In a state when a card is inserted, the main body 25 of the waterproof mechanism 20 is completely located within the sleeve 135, and the second end portion 22 is blocked to be outside the sleeve 135.

A protrusion (not shown) is formed in an end surface of the second end portion 22, and a groove (not labeled) corresponding to the protrusion is provided in a surface of the end portion 122 of the push rod 121, so to achieve position fixing of the waterproof mechanism 20 and the push rod 121, thereby preventing an applied force from being skewed.

The first end portion 21 of the waterproof mechanism 20 is inserted into the sleeve 135 from an end of the sleeve 135 facing away from the cover plate 132, and the waterproof ring 23 sleeved on a periphery of the main body 25 and the inner wall of the sleeve 135 form a sealing structure. When it is needed to retract the card, a card-retracting needle (not shown) is inserted from the through-hole 133, so as to abut against the recess 26 of the waterproof mechanism 20 and push the waterproof mechanism 20 to move. The second end portion 22 of the moving waterproof mechanism 20 pushes the end portion 122 of the push rod 121 backwards to complete the card retraction. During this process, the waterproof ring 23 at the periphery of the waterproof mechanism 20 and the inner wall of the sleeve 135 achieve sealing, preventing external water molecules from entering the inside of the mobile terminal through the sleeve 135.

The card holder 13 or the cover plate 132 of the card holder 13 is manufactured by a CNC process or a powder metallurgy process. In one embodiment, the waterproof circle 136 is sleeved on the periphery of the cover plate 132 and achieves sealing with a slot 32 of the metal casing 30.

In the card holder and the waterproof card seat according to the present disclosure, the sleeve 135 is provided to integrally extend from the through-hole 133 of the cover plate 132 of the card holder 13 towards the card seat, and the waterproof mechanism 20 is disposed within the sleeve 135 and forms a sealing structure with the sleeve 135, so that the card retraction and waterproof property can be achieved at the same time through movement of the waterproof mechanism 20.

Embodiment 2

Figure 5:
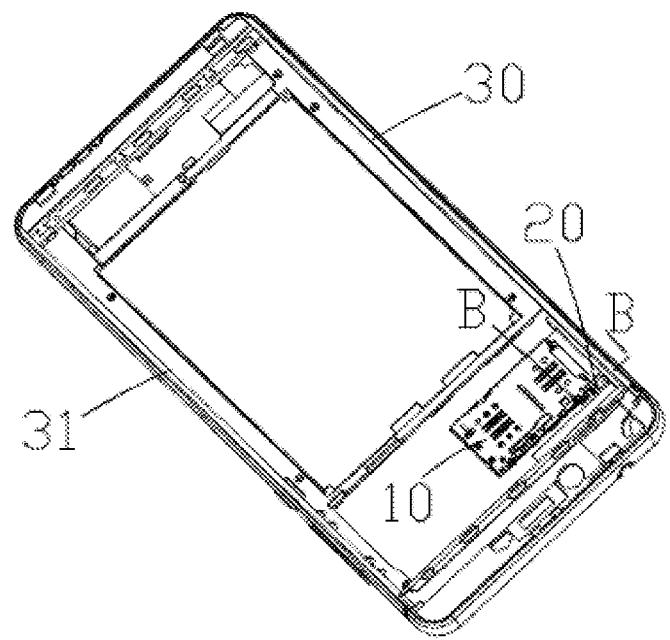
FIG. 5 to FIG. 8 are schematic diagrams of a metal casing according to Embodiment 2 of the present disclosure.
Figure 6:
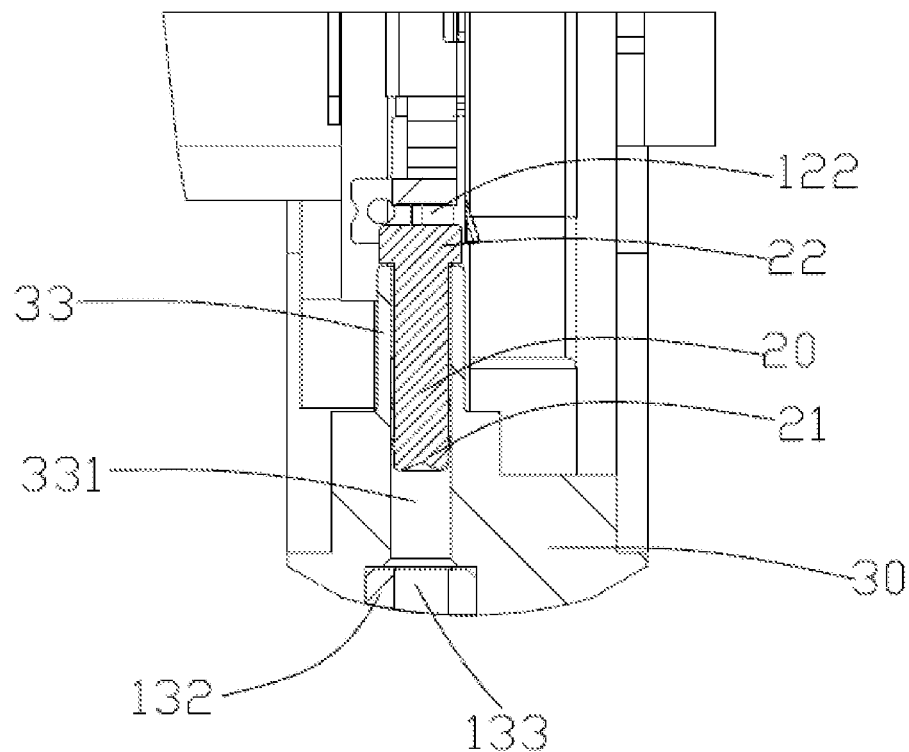
Figure 7:
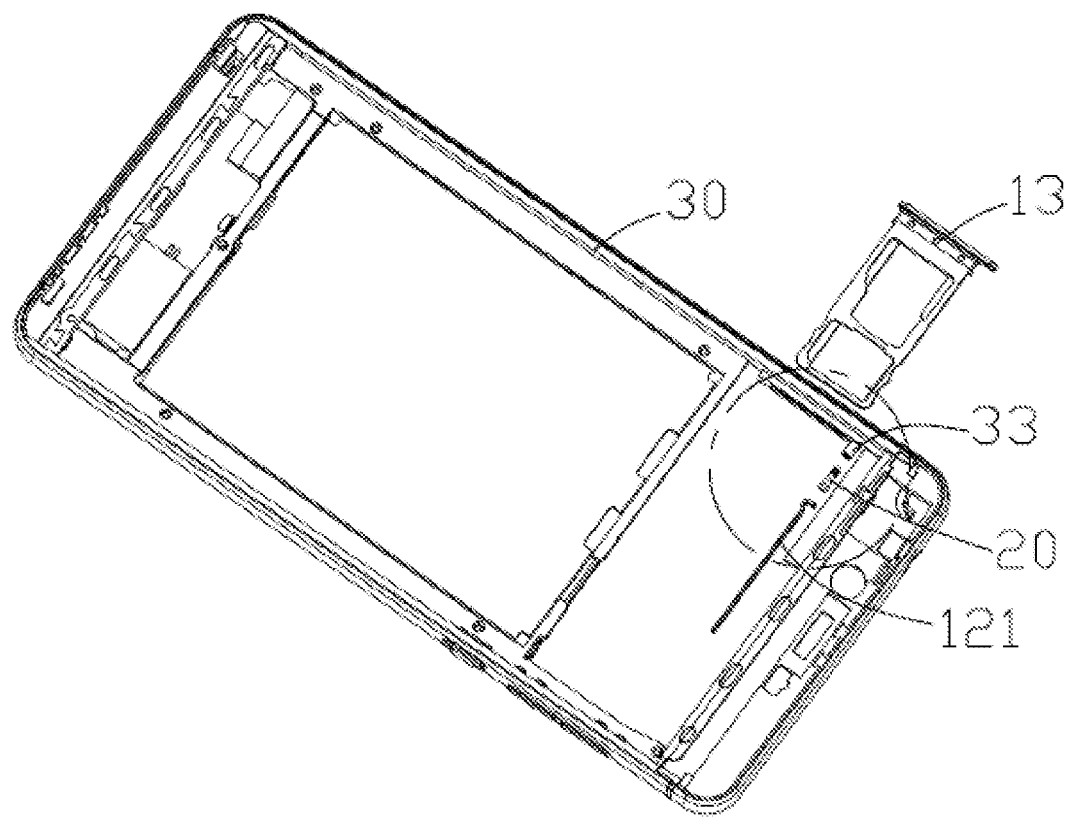
Figure 8:
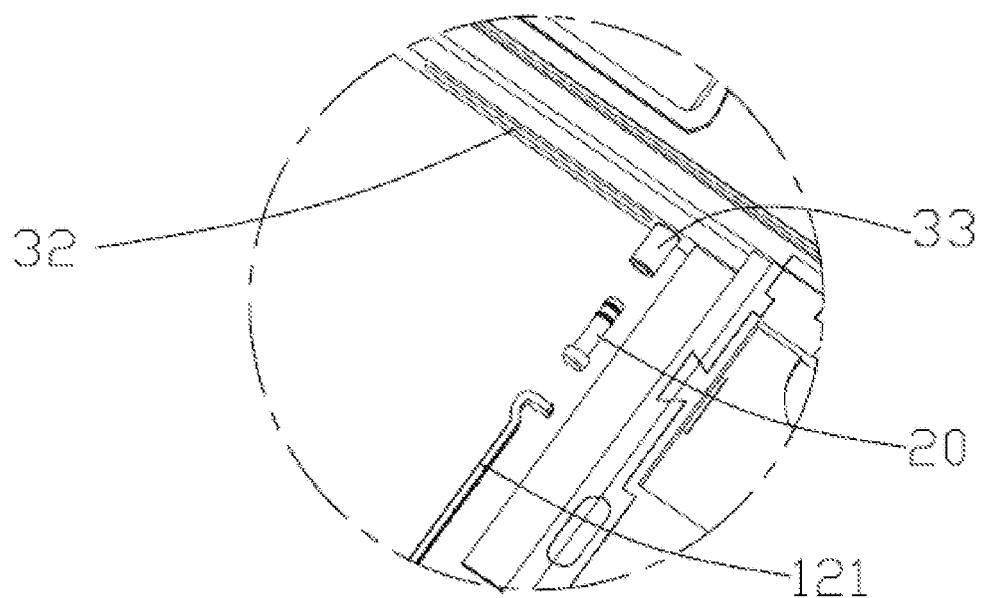

Referring to FIG. 5 to FIG. 8, compared with Embodiment 1, Embodiment 2 mainly relates to a metal casing 30, such as a metal middle frame, a metal casing or the like for a mobile phone or a tablet computer. The metal casing 30 includes a frame portion 31 and a slot 32 transversely penetrating through the frame portion 31, and the card holder 13 is to be inserted through the slot 32. The sleeve 33 according to Embodiment 2, compared with that according to Embodiment 1, is integrated with an inner side of the frame portion 31 of the metal casing 30, and the through-hole 331 of the sleeve 33 penetrates through the frame portion 31 and corresponds to the through-hole 133 on the side of the cover plate 13 of the card holder 13, so as to facilitate the insertion of the card-retracting needle. In other embodiments, the cover plate 132 of the card holder 13 may not be provided with the through-hole 133, and the through-hole 133 can be directly disposed at the outside of the frame portion 31. That is, the card-retracting needle is directly inserted from the outside of the frame portion 31 to push the first end portion 21 to perform card retraction.

In the present embodiment, the waterproof circle 136 is disposed on the periphery of the connecting portion 134 or the cover plate 132. The operation principle of the waterproof mechanism 20 is the same as that according to Embodiment 1, and will not be repeated within the description.

Embodiment 3

Figure 9:
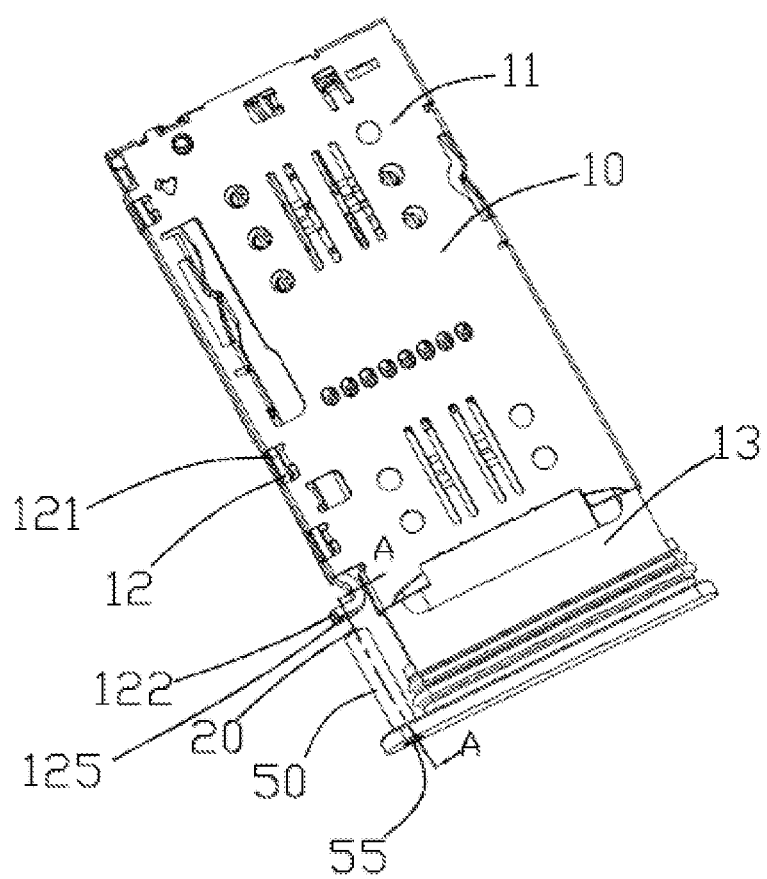
FIG. 9 to FIG. 12 are schematic diagrams of a waterproof card seat according to Embodiment 3 of the present disclosure.
Figure 10:
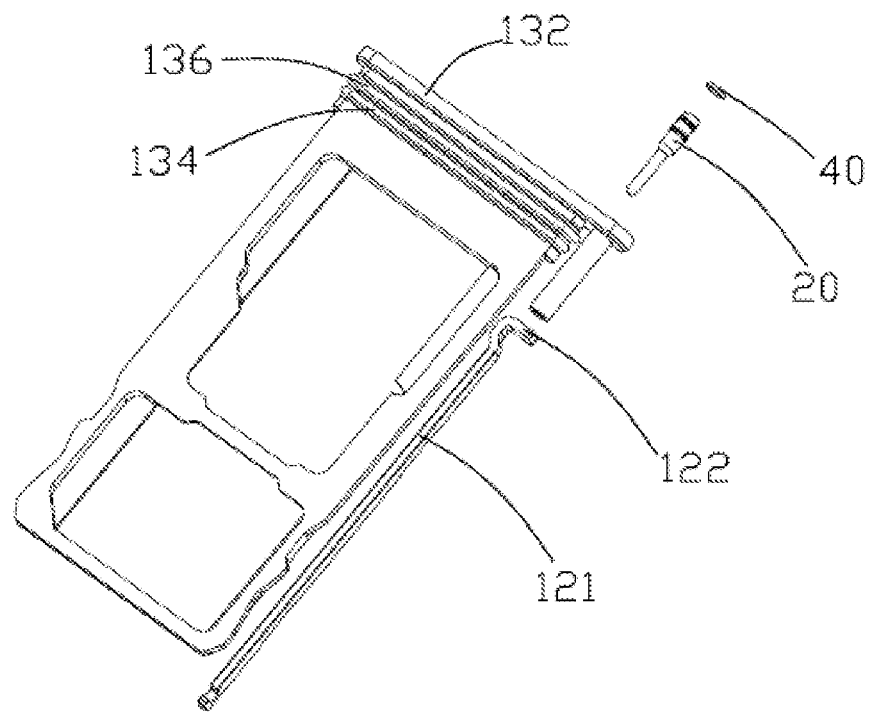
Figure 11:
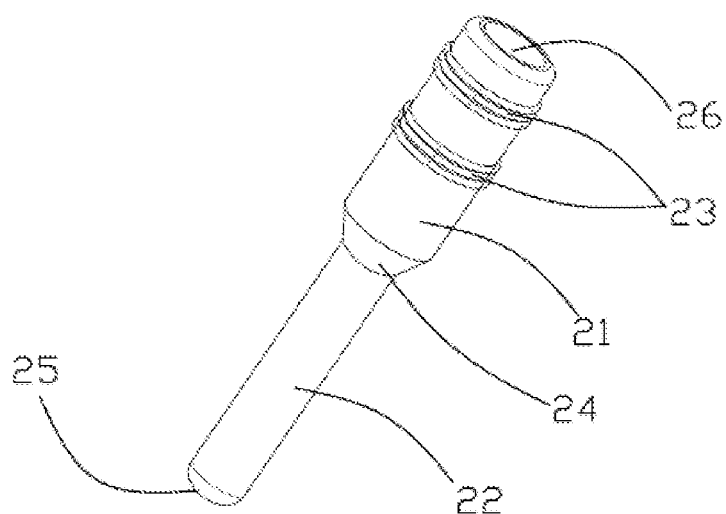
Figure 12:
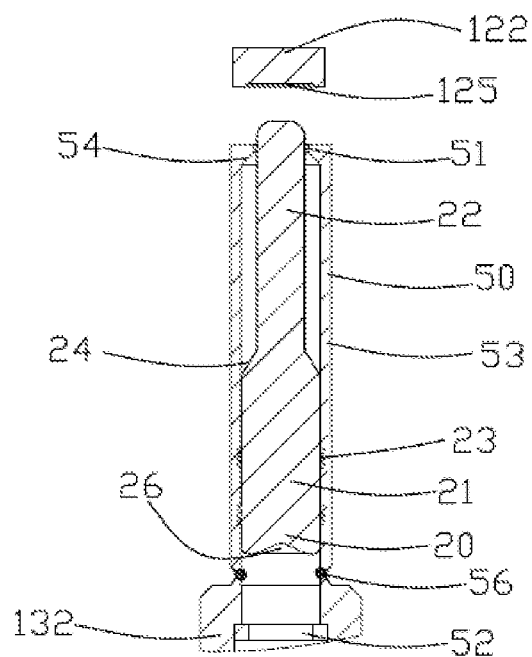

Referring to FIG. 9 to FIG. 12, the waterproof card seat according to the present disclosure includes a terminal module (not shown), a metal casing 11, a card retracting mechanism 12, a card holder 13, and a waterproof mechanism 20.

Compared with Embodiment 1, the card holder 13 according to the present embodiment is integrated with and extends from the inner side of the cover plate 132 to form a sleeve 50 and a through-hole 55 penetrating through the sleeve 50 and the cover plate 132.

The sleeve 50 includes a sleeve body 53, a first opening 51 located at an inner side of the sleeve body 53, and a second opening 52 located at an outer side of the cover plate 132.

The waterproof mechanism 20 includes a first end portion 21 located in the through-hole 55 of the sleeve 50, a second end portion 22 integrated with and extending from an end of the first end portion 21 towards the card retracting mechanism 12, and a waterproof ring 23 sleeved on the periphery of the first end portion 21. An end surface of the first end portion 21 is recessed to form a recess 26 to prevent the card-retracting needle from being skewed when contacting the first end portion 21. A protrusion 25 is formed in an end surface of the second end portion 22, and a recess 125 corresponding to the protrusion 25 is formed at an end portion 122 of the push rod 121 of the card retracting mechanism 12 that contacts the second end portion 22, so as to prevent deflecting and slipping of the contact. An outer diameter of the first end portion 21 is greater than an outer diameter of the second end portion 22, and a first blocking slope 24 is formed at a junction between the first end portion 21 and the second end portion 22. The first end portion 21 passes through the first opening 51 of the sleeve 50 to be in contact with the push rod 121. The outer diameter of the first end portion 21 is not greater than an inner diameter of the sleeve body 53.

In an embodiment, the waterproof mechanism 20 is inserted from the second opening 52 of the sleeve 50, an inner diameter of the first opening 51 is smaller than the outer diameter of the first end portion 21 of the waterproof mechanism 20, and an inner diameter of the second opening 52 is not smaller than the outer diameter of the first end portion 21 of the waterproof mechanism 20. After the waterproof mechanism 20 has been inserted into the sleeve 50, a second blocking slope 54 is formed on an inner side of the first opening 51 facing towards the second opening 52 and cooperates with the first blocking slope 24 of the waterproof mechanism 20, so as to prevent the waterproof mechanism 20 from being further pushed. An open-ring metal elastic member 40 is clipped in the second opening 52 to prevent the waterproof mechanism 20 from exiting from the second opening 52. In this situation, the open-ring metal elastic member 40 has an inner diameter smaller than the outer diameter of the first end portion 21 of the waterproof mechanism 20. Alternatively, the second opening 52 is subjected to another stamping in such a manner that an edge portion of the second opening 52 is pressed towards a circle center to form an inner diameter for the second opening smaller than the outer diameter of the first end portion 21 of the waterproof mechanism 20. In this way, the waterproof mechanism 20 can be prevented from exiting from the second opening 52.

In another embodiment, the waterproof mechanism 20 is inserted from the first opening 51 of the sleeve 50, and the inner diameter of the second opening 52 is smaller than the outer diameter of the first end portion 21 of the waterproof mechanism 20, in order to prevent the waterproof mechanism 20 from exiting from the second opening 52. After the waterproof mechanism 20 has been inserted from the first opening 51, the inner diameter of the first opening 51 is greater than the outer diameter of the first end portion 21 of the waterproof mechanism 20. In this situation, an open-ring metal elastic member 40 is pressed in to limit a position of the waterproof mechanism 20. At the same time, the open-ring metal elastic member 40 is correspondingly provided with a second blocking slope facing the first blocking slope 24. Alternatively, after the waterproof mechanism 20 has been inserted into the sleeve body 53, the first opening 51 is pressed along a radial direction to make the inner diameter of the first opening 51 be smaller than the outer diameter of the first end portion 21 of the waterproof mechanism 20.

In another embodiment, the waterproof mechanism 20 is inserted from the second opening 52 of the sleeve 50, the inner diameter of the first opening 51 is smaller than the outer diameter of the first end portion 21 of the waterproof mechanism 20, and the inner diameter of the second opening 52 is not smaller than the outer diameter of the first end portion 21 of the waterproof mechanism 20. After the waterproof mechanism 20 has been inserted into the sleeve 50, a second blocking slope 54 is formed on an inner side of the first opening 51 facing the second opening 52 and cooperates with the first blocking slope 24 of the waterproof mechanism 20, so as to prevent the waterproof mechanism 20 from being further pushed. The sleeve body 53 is pressed towards the circle center at a position close to the cover plate 132 to form a limiting ring 56, which has an inner diameter smaller than the outer diameter of the first end portion 21 of the waterproof mechanism 20, thereby preventing the waterproof mechanism 20 from exiting from the second opening 52.

The waterproof ring 23 located outside the first end portion 21 of the waterproof mechanism 20 and the inner wall of the sleeve body 53 of the sleeve 50 form a sealing structure. When it is needed to retract the card, a card-retracting needle (not shown) is inserted from the through-hole 55 to abut against the recess 26 of the waterproof mechanism 20 and thus push the waterproof mechanism 20 to move, and the second end portion 22 of the moving waterproof mechanism 20 pushes the end portion 122 of the push rod 121 backwards to complete the card retraction. During this process, the waterproof ring 23 at the periphery of the waterproof mechanism 20 and the inner wall of the sleeve body 53 achieve sealing, preventing external water molecules from entering the inside of the mobile terminal through the sleeve 50.

The card holder 13 or the cover plate 132 of the card holder 13 is manufactured by a CNC process or a powder metallurgy process. In Embodiment 3, the waterproof circle 136 is sleeved on the periphery of the cover plate 132 and achieves sealing with a slot 32 of the metal casing 30.

In the card holder and the waterproof card seat according to the present disclosure, the sleeve 50 is provided to integrally extend from the through-hole 55 of the cover plate 132 of the card holder 13 towards the card seat, and the waterproof mechanism 20 is disposed within the sleeve 50 and forms a sealing structure with the sleeve 50, so that the card retraction and waterproof property can be achieved at the same time through movement of the waterproof mechanism 20.

Embodiment 4

Figure 13:
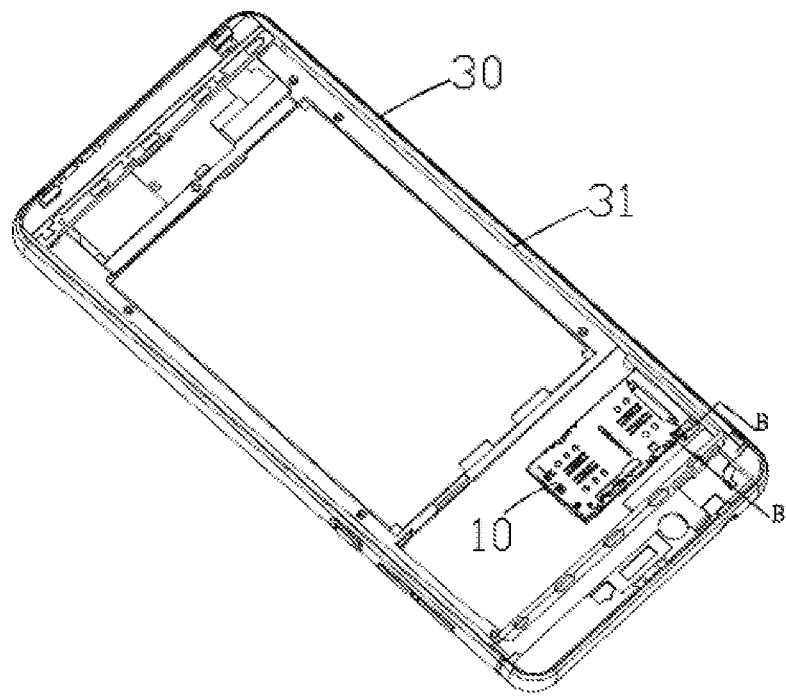
FIG. 13 to FIG. 16 are schematic diagrams of a metal casing according to Embodiment 4 of the present disclosure.
Figure 14:
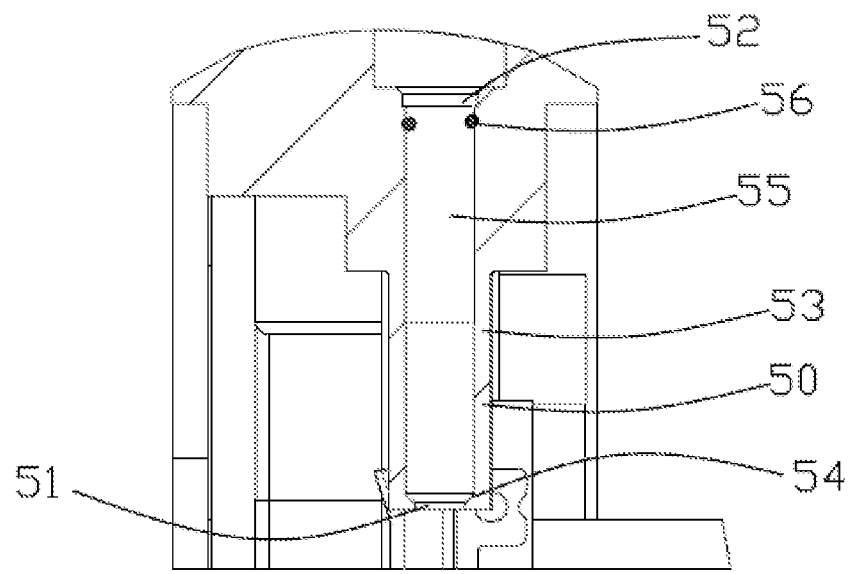
Figure 15:
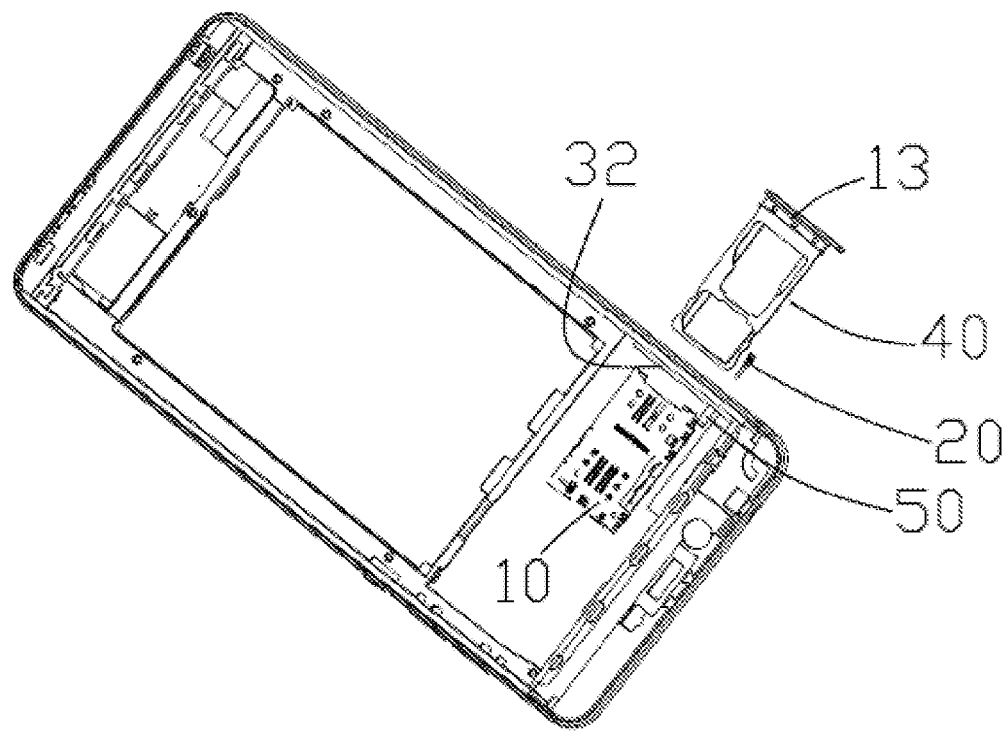
Figure 16:
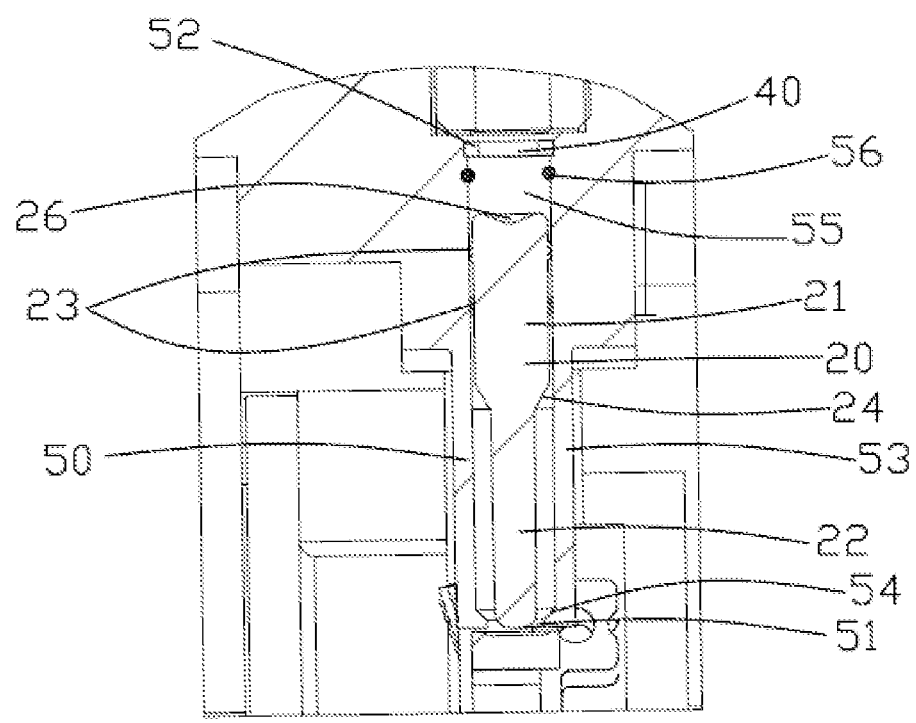

Referring to FIG. 13 to FIG. 16, compared with Embodiment 3, Embodiment 4 mainly relates to a metal casing 30, such as a metal middle frame, a metal casing, or the like for a mobile phone or a tablet computer. The metal casing 30 includes a frame portion 31, and a slot 32 transversely penetrating through the frame portion 31, and the card holder 13 is to be inserted through the slot 32. The sleeve 50 according Embodiment 4, compared with that according to Embodiment 3, is integrated with on an inner side of the frame portion 31 of the metal casing 30, and the through-hole 55 of the sleeve 50 penetrates through the frame portion 31 to facilitate the insertion of the card-retracting needle.

In the present embodiment, the waterproof circle 136 may be disposed on the periphery of the connecting portion 134 or the cover plate 132. The operation principle of the waterproof mechanism 20 is the same as that according to Embodiment 3, and will not be repeated herein.

It should be understood that the terms "comprise", "include" or any other variants are intended to encompass a non-exclusive inclusion, such that a process, a method, a product, or an apparatus also includes described as including a series of element also includes other elements that are not explicitly listed, or elements that are inherent to such a process, method, product, or apparatus. Without any further limitations, the process, method, product, or apparatus defined by the expression "comprising an element" or "including an element" does not exclude the presence of other equivalent elements.

The above description is a part of embodiments of the present disclosure, rather than limit the scope of the present disclosure. Those skilled in the art understand that the technical solutions of the above embodiments can be modified. Any modification, equivalent substitution, or improvement made without departing from the spirit and principle of the present disclosure shall fall within the protection scope defined by the claims.

What is claimed is:

1. A waterproof card holder, comprising:
   a card holder frame;
   a cover plate located at a top of the card holder frame;
   a sleeve integrated with and extending from an inner side of the cover plate, including a through-hole penetrating through the sleeve and the cover plate, wherein the sleeve comprises a sleeve body, a first opening and a second opening, the first opening and the second opening being disposed at two ends of the sleeve body, respectively; and
   a waterproof mechanism accommodated in the sleeve, wherein the waterproof mechanism comprises a first end portion limited to be inside the sleeve, a second end portion having an outer diameter smaller than that of the first end portion, and a waterproof ring sleeved on a periphery of the first end portion, wherein the waterproof ring and the sleeve form a sliding sealing structure therebetween, the first end portion is limited to be only movable within a stroke between the first opening and the second opening, and the second end portion is capable of passing through the first opening to be in contact with a card retracting mechanism;

wherein the first opening has an inner diameter smaller than an outer diameter of the first end portion; a first blocking slope is formed at a junction between the first end portion and the second end portion; and a second blocking slope, corresponding to and cooperating with the first blocking slope, is formed on a side of the first opening facing the second opening; and wherein the sleeve has an axis, the through hole is aligned with the axis, and the first blocking slope and the second blocking slope are each at an oblique angle relative to the axis.

2. The waterproof card holder according to claim 1, comprising a waterproof circle disposed on a periphery of the cover plate, wherein the waterproof circle and an inner side wall of a slot of a metal casing form a sealing structure.

3. The waterproof card holder according to claim 1, wherein
the waterproof mechanism is inserted from the second opening of the sleeve, and
once the waterproof mechanism is inserted,
an open-ring metal elastic member having an inner diameter smaller than an outer diameter of the first end portion is clipped in the second opening, or
the second opening is stamped in such a manner that the inner diameter of the second opening becomes smaller and is smaller than the outer diameter of the first end portion.

4. The waterproof card holder according to claim 1, wherein
the second opening has an inner diameter smaller than an outer diameter of the first end portion;
the waterproof mechanism is inserted from the first opening of the sleeve; and
once the waterproof mechanism is inserted, the first opening is pressed towards a circle center in such a manner that an inner diameter of the first opening is smaller than the outer diameter of the first end portion.

5. The waterproof card holder according to claim 1, wherein
the second opening has an inner diameter smaller than an outer diameter of the first end portion;
the waterproof mechanism is inserted from the first opening of the sleeve; and
once the waterproof mechanism is inserted, an open-ring metal elastic member having an inner diameter smaller than an outer diameter of the first end portion is riveted in the first opening.

6. A metal casing, comprising a frame portion, a slot penetrating through the frame portion, and a sleeve integrated with an inner side of the frame portion, a waterproof card holder for an electric card being to be inserted through the slot, wherein the sleeve is hollow to form a through-hole penetrating through the frame portion, a waterproof mechanism is accommodated in the sleeve, and the waterproof mechanism comprises a first end portion limited to be inside the sleeve, a second end portion having an outer diameter smaller than that of the first end portion, and a waterproof ring located on a periphery of the first end portion; the waterproof ring and an inner wall of the sleeve form a sliding sealing structure; the waterproof mechanism is movable by being pushed in an extending direction of the sleeve; the sleeve comprises a sleeve body, a first opening and a second opening, the first opening and the second opening being disposed at two ends of the sleeve body, respectively; and the first end portion is limited to be only movable within a stroke between the first opening and the second opening, and the second end portion is capable of passing through the first opening to be in contact with a card retracting mechanism;

a first blocking slope is formed at a junction between the first end portion and the second end portion, and a second blocking slope, corresponding to and cooperating with the first blocking slope, is formed on a side of the first opening facing the second opening; and the first blocking slope and the second blocking slope are each at an oblique angle relative to the extending direction of the sleeve.

7. The metal casing according to claim 6, wherein the first opening has an inner diameter smaller than an outer diameter of the first end portion.

8. The metal casing according to claim 7, wherein a recess is formed in an outer end of the first end portion for position fixing of a card-retracting needle and being abutted against the card-retracting needle.

9. The metal casing according to claim 6, wherein the waterproof card holder comprises a card holder frame, a cover plate located at top of the card holder frame, and a waterproof circle sleeved on a periphery of the cover plate, wherein the waterproof circle on the periphery of the cover plate and the slot form a sealing structure therebetween.

10. The metal casing according to claim 6, wherein, the waterproof mechanism is inserted from the second opening of the sleeve, and once the waterproof mechanism is inserted into the sleeve, an open-ring metal elastic member having an inner diameter smaller than an outer diameter of the first end portion is clipped in the second opening, or the second opening is stamped in such a manner that the inner diameter of the second opening becomes smaller and is smaller than the outer diameter of the first end portion.

11. The metal casing according to claim 6, wherein the waterproof mechanism is inserted from the second opening of the sleeve, and once the waterproof mechanism is inserted into the sleeve, a side of the sleeve close to the second opening is pressed towards a circle center to form a position limiting ring having an inner diameter smaller than the outer diameter of the first end portion.

12. The metal casing according to claim 6, wherein the second opening has an inner diameter smaller than an outer diameter of the first end portion, the waterproof mechanism is inserted from the first opening of the sleeve, and once the waterproof mechanism is inserted into the sleeve, the first opening of the sleeve is pressed towards a circle center in such a manner that an inner diameter of the first opening becomes smaller and is smaller than the outer diameter of the first end portion.

13. The metal casing according to claim 6, wherein the second opening has an inner diameter smaller than an outer diameter of the first end portion, the waterproof mechanism is inserted from the first opening of the sleeve, and once the waterproof mechanism is inserted into the sleeve, an open-ring metal elastic member having an inner diameter smaller than an outer diameter of the first end portion is riveted in the first opening.

* * * * *